United States Patent [19]
Lee

[11] Patent Number: 6,023,437
[45] Date of Patent: Feb. 8, 2000

[54] SEMICONDUCTOR MEMORY DEVICE CAPABLE OF REDUCING A PRECHARGE TIME

[75] Inventor: Jung-Hwa Lee, Kyunggi-do, Rep. of Korea

[73] Assignee: Samsung Electronics Co., Ltd., Suwon, Rep. of Korea

[21] Appl. No.: 09/196,212

[22] Filed: Nov. 20, 1998

[30] Foreign Application Priority Data

Nov. 20, 1997 [KR] Rep. of Korea .................. 97-61348

[51] Int. Cl.⁷ .................................................... G11C 7/00
[52] U.S. Cl. ...................... 365/203; 365/230.03; 365/202
[58] Field of Search ............................. 365/203, 230.03, 365/202, 205

[56] References Cited

U.S. PATENT DOCUMENTS

| 5,627,789 | 5/1997 | Kalb, Jr. ................................ 365/205 |
| 5,822,264 | 10/1998 | Tomishima et al. ........... 365/230.03 X |
| 5,886,936 | 3/1999 | Yang ...................................... 365/203 |

*Primary Examiner*—Huan Hoang
*Attorney, Agent, or Firm*—Jones Volentine, L.L.P.

[57] ABSTRACT

A high density semiconductor memory device of the present invention provides equalizing circuits for equalizing isolation signals that control a connection between bit lines and sense amplifiers. During a row precharge operation, the equalizing circuits, in response to block selection signals, equalize the isolation signals for transferring signals. As a result, this shortens the required row precharge time.

7 Claims, 4 Drawing Sheets

SEMICONDUCTOR MEMORY DEVICE CAPABLE OF REDUCING A PRECHARGE TIME

This application relies for priority upon Korean Patent Application No. 97-61348, filed on Nov. 20, 1997, the contents of which are herein incorporated by reference in their entirety.

1. Field of the Invention

The present invention relates to semiconductor memory devices, and more particularly to integrated circuits used in semiconductor memories in order to reduce a precharge time during a row precharge mode.

2. Background of the Invention

In recent years, as the integration rate of semiconductor memory devices has increased, memory cell arrays have become more densified. As a result, the propagation speed of signals may be degraded because of parasitic resistances strayed through signal lines that increase along with increased chip sizes and a higher density of device. With an increase in the chip size, the length and resistances of signal lines are also increasingly magnified. Meanwhile, the resistance of signal lines can also increase when Tungsten(W), instead of Aluminum (Al) is used to fill contact holes, which obtains worse contact hole characteristic, or when the signal line thicknesses are lowered to reduce an interlayer topology.

A semiconductor memory device such as a dynamic random access memory (DRAM), as is well known to one skilled in the art, has a structure in which input/output sense amplifiers are shared by two adjacent memory cell blocks, and in which isolation transistors are used to electrically connect or disconnect the I/O sense amplifier with a corresponding one of the memory cell blocks for a read operation. When one of the two adjacent memory cell blocks is selected, those isolation transistors connect the I/O sense amplifier to the selected memory cell block and disconnect the I/O sense amplifier from the non-selected memory cell block. Each of the isolation transistors assigned to the memory cell block is controlled by corresponding control signals.

Generally, during a read/write operation with a selected word line, control signals for the isolation transistors corresponding to the each memory cell block maintain higher voltage levels than that of an external power source voltage. As a result, the isolation transistor electrically connects a pair of bit lines corresponding to the selected memory cell block to a corresponding I/O sense amplifier. On the other hand, as the voltage level of control signals for the isolation transistor corresponding to the non-selected memory cell block is held in a ground level, a pair of bit-lines corresponding to the non-selected memory cell block is not connected to its corresponding I/O sense amplifier. During a row precharge operation for which a word line is not activated, a row address strobe signal is disabled, and the control signals for the isolation transistors corresponding to the two adjacent memory cell blocks are precharged and equalized. The time for precharging and equalizing the control signals is an important factor in determining an access speed of a read/write operation so that recycling operations of precharging and activating with the control signals should be performed while reading or writing. While the row address strobe signal is being disabled, the row precharge operation shall be finished within a time limit that at least secures an active cycle time and a stable read/write operation. If, for instance, the precharge time for the control signal lines assigned to the cell blocks is lengthened, the operating time of the next cycle operation would be delayed thereby. As a result, the delay of the precharge time results in an increase of an entire operating time for the read/write cycle.

SUMMARY OF THE INVENTION

The present invention is intended to solve these problems. It is also an object of the invention to provide a row precharge circuit for high density semiconductor memory device that can shorten a row precharge time.

Another object of the invention is to provide a high density semiconductor memory device having an enhanced operating speed in a precharge cycle.

According to one aspect of the present invention to accomplish the above object, a semiconductor memory device includes a plurality of memory cell blocks, a plurality of bit line pairs connected to the memory cell blocks, a plurality of sense amplifiers connected to the bit line pairs, one or more bit line equalizing circuit for equalizing the bit line pairs in the memory cell blocks in response to bit line equalizing signals, one or more isolation gate circuits disposed between the sense amplifiers and the memory cell blocks, and responsive to isolation signals, a first circuit for equalizing the isolation signals in response to isolation gate equalizing signals, and a second circuit for equalizing the isolation signals in response to bit line equalizing signals.

The semiconductor memory device may further include a block selection circuit for generating a plurality of block selection signals in response to address signals; a first control circuit for generating the bit line equalizing signals in response to the block selection signals; and a second control circuit for generating the isolation signals and the isolation gate equalizing signals in response the block selection signals.

Another aspect of the invention is preferred to be a semiconductor memory device having at least two memory cell blocks coupled to at least a pairs of bit lines, and a sense amplifier coupled to the pairs of bit lines, and being shared by the memory cell blocks, the device comprising, one or more bit line equalizing circuits for equalizing the bit line pairs in the memory cell blocks, one or more isolation gate circuits disposed between the sense amplifiers and the memory cell blocks, a block selection circuit for generating plurality of block selection signals in response to address signals, a first control circuit for generating bit line equalizing signals applied to the bit line equalizing circuits, responding to an output of the block selection circuit, a second control circuit for generating isolation signals and isolation gate equalizing signals, a first circuit for equalizing the isolation signals in response to the isolation gate equalizing signals, and a second circuit for equalizing the isolation signals in response to the bit line equalizing signals.

The invention can promotes the drivability and speed of the row precharge operation can be enhanced thereof because the isolation signals are equalized at the same time and accelerated by the two equalizing circuits, the drivability and speed of the row pre charge operation can be enhanced. A shorter precharge time for the isolation signals makes possible an increase of an overall operating speed in a semiconductor memory device.

BRIEF DESCRIPTION OF THE DRAWINGS

For a better understanding of the invention, and to show how preferred embodiments of the same may be carried into effect, reference will now be made, by way of example, to the accompanying drawings, in which.

In these figures, like reference numerals denote like or corresponding parts, and the suffix "B" for a signal name denotes that the signal operates in response to a negative logic.

DETAILED DESCRIPTION OF PREFERRED EMBODIMENTS

Preferred embodiments of the present invention are shown below, in accordance with the appended drawings. The invention is preferably practiced with a dynamic random access memory.

Figure 1:
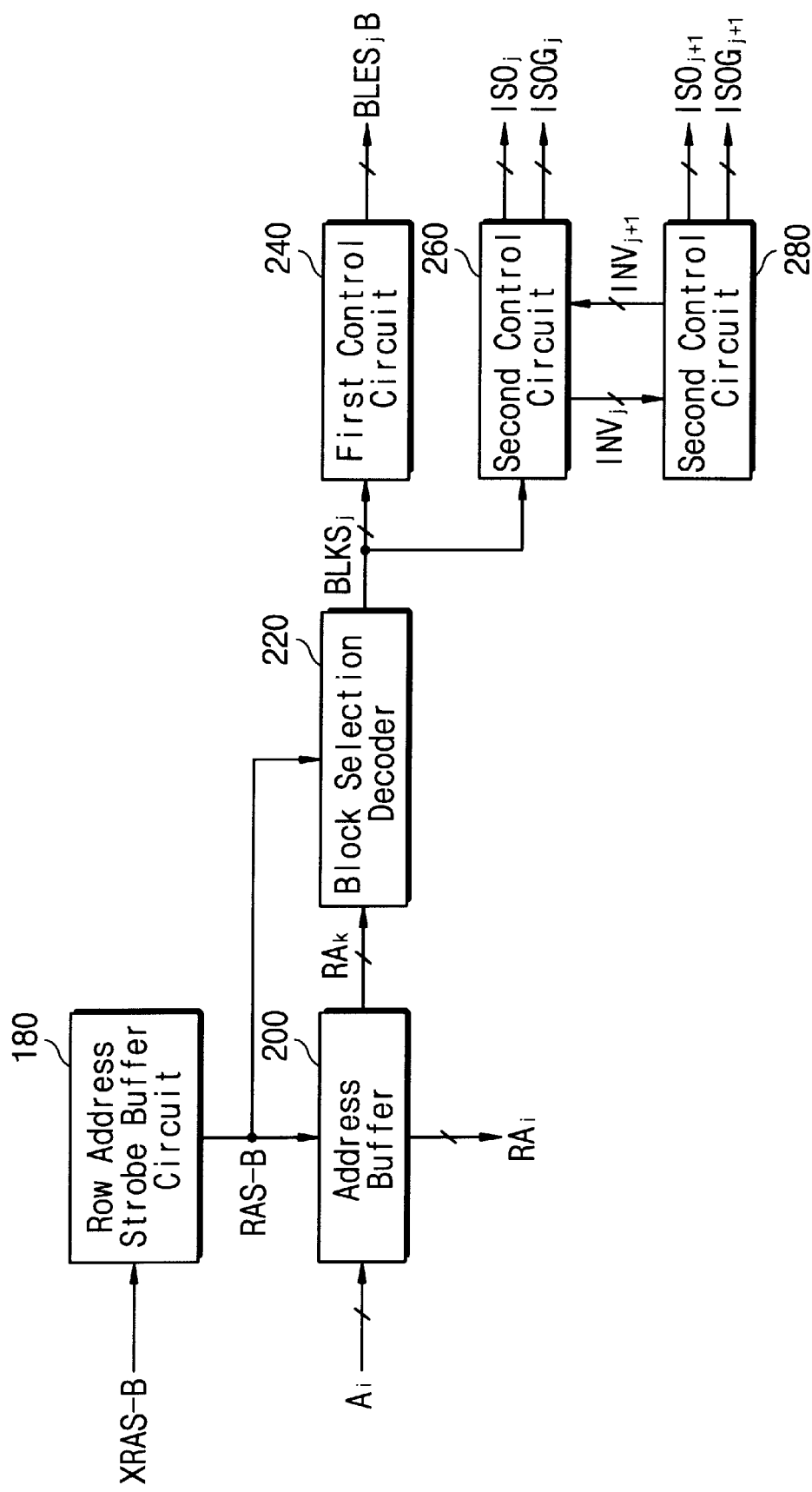
FIG. 1 is block diagram of circuits for generating isolation and equalizing signals according to a preferred embodiment of the present invention.

FIG. 1 shows a construction of elementary circuits for making isolation and equalizing signals according to a preferred embodiment of the present invention. Referring to FIG. 1, the dynamic random access memory of the invention includes a row address strobe buffer circuit 180, an address buffer 200, a block selection decoder 220, a first control circuit 240, and a second control circuit 260.

The row address strobe buffer 180 receives an external row address strobe signal XRAS-B at a TTL voltage level, and then generates an internal row address strobe signal RAS-B at a CMOS voltage level. The address buffer circuit 200 receives an external address signals $A_i$ ("i" includes plural address signals) at a TTL voltage level and then generates a first row address signal $RA_i$ with a CMOS voltage level. The first row address signal $RA_i$ ("i" includes plural row address signals) is provided to a row decoder (not shown in FIG. 1). The block selection decoder 220 generates block selection signals $BLKS_j$ (the "j" represents one out of plural block selection signals, for the convenience of description throughout this specification) assigned to each of memory cell blocks, in response to the row address strobe signal RAS-B and a second row address signal $RA_k$ (the "k" may include plural row address signals for designating the memory cell blocks) for selecting a memory cell block. The second row address signal $RA_k$ is also generated from the address buffer 200 together with the first row address signal $RA_i$. The first control circuit 240 receives a block selection signal $BLKS_j$ and then generates a bit line equalizing signal $BLES_j$-B for activating bit line equalization circuits (shown in FIG. 3) assigned to a memory cell block. The second control circuit 260 receives a block selection signal $BLKS_j$ and then generates the isolation signals $ISO_j$ for activating isolation gate circuits connected to bit lines of a memory cell block, and isolation gate equalizing signals $ISOG_j$.

Figure 2:
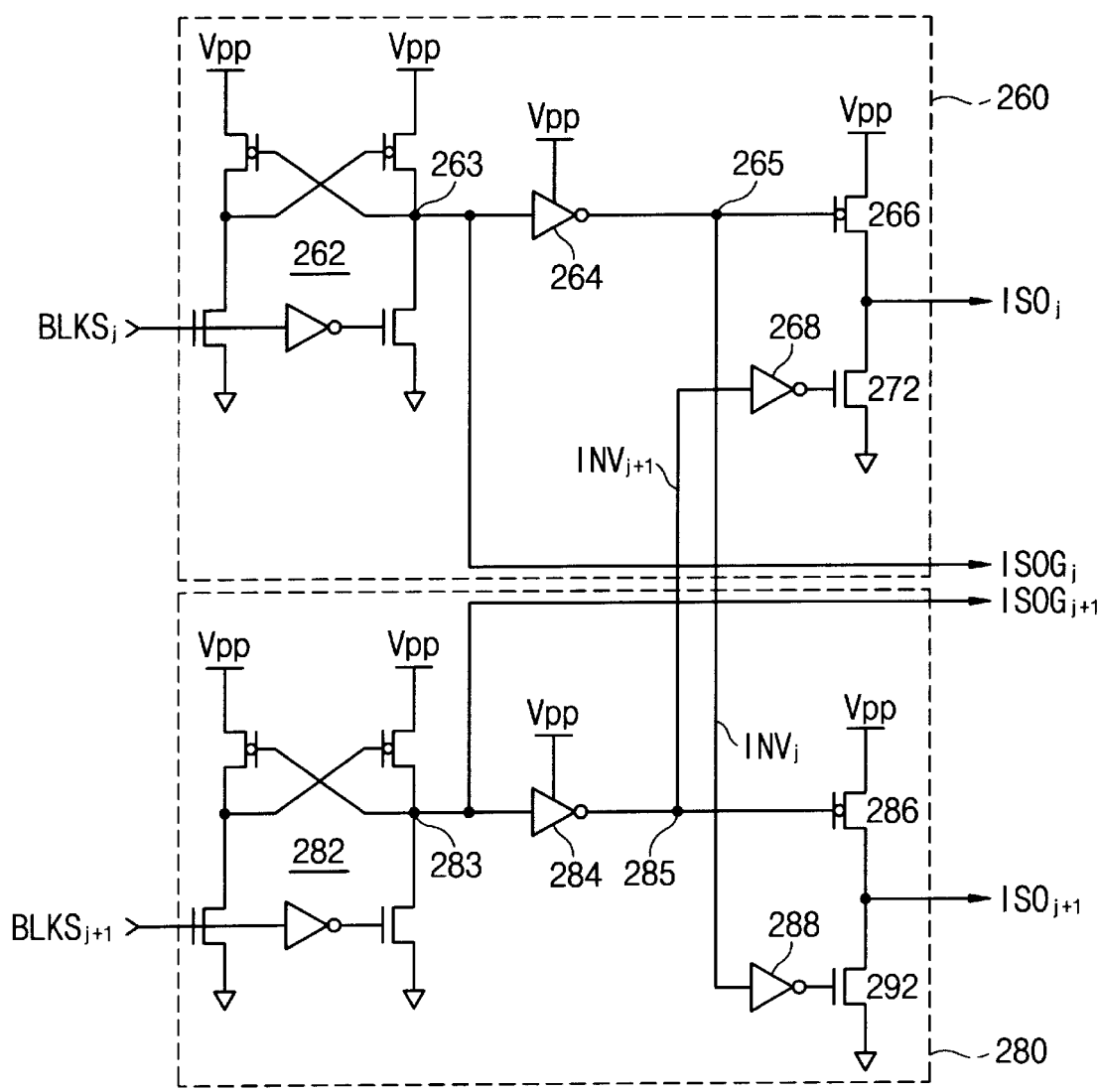
FIG. 2 is a circuit diagram of the second control circuit of FIG. 1, for generating isolation signals.

FIG. 2 shows a configuration of a second control circuit 260 receiving a block selection signal $BLKS_j$, including another second control circuit 280, which is assigned to another memory cell block adjacent to the memory cell block connected to the circuit 260. Second control circuits 260 and 280 are in the same circuit structure. In the circuit 260, $BLKS_j$ is applied to level shift circuit 262 whose output node 263 is coupled to the gate of a PMOS transistor 266 through an inverter 264. The PMOS transistor 266 is connected between a high voltage $V_{PP}$ and the signal $ISO_j$. Between the signal $ISO_j$ and a ground voltage (or a substrate voltage), an NMOS transistor 272 is connected. The gate of NMOS transistor 272 receives the output of a level shift circuit 282 (corresponding to 262) through an inverter 284, corresponding to 264, and an inverter 268. The output of inverter 284 is the signal $INV_{j+1}$. The output node of the level shift circuit 262 is also applied to isolation gate equalizing circuits (shown in FIG. 3 as reference numerals 300 and 320) and to the output of the inverter 264, the signal $INV_j$, is applied to a gate of an NMOS transistor 292 (corresponding to 272) of the adjacent second control circuit 280 through inverter 288 (corresponding to 268). The outputs of level shift circuits 262 and 282 become the isolation gate equalizing signals $ISOG_j$ and $ISOG_{j+1}$ which are applied to the isolation gate equalizing circuits. In the adjacent circuit 280, the node between the PMOS and NMOS transistors, 286 and 292, is rendered to be the signal $ISO_{j+1}$.

If the signal $BLKS_j$ is enabled to a high level while the signal $BLKS_{j+1}$ is being disabled, the signal $ISO_j$ goes to a voltage of $V_{PP}$ (higher than a power supply voltage of the device) and the signal $ISO_{j+1}$ is held to the ground voltage. When all of the signals $BLKS_j$, $BLKS_{j+1}$, are laid to low levels in a row precharge operation, both of the signals $ISO_j$, $ISO_{j+1}$ are not driven into any state, i.e., they enter a high impedance state, due to an absence of biasing condition thereto, thereby maintaining their previous states.

Referring again to FIG. 3, a plurality of bit line pairs $BL_1/BL_1$-B~$BL_n/BL_n$-B are connected to memory cell blocks $100_j$ and $100_{j+1}$. The bit line equalizing circuits 120, which are formed of three NMOS transistors M1, M2, and M3, are interposed between the bit lines by the pairs of themselves in order to set the bit line pairs into a same voltage level. The gates of the NMOS transistors M1, M2, and M3 are commonly connected to bit line equalizing signals $BLES_j$-B and $BLES_{j+1}$-B, generated from the first control circuits 240. Sense amplifier-input/output gating circuits 140 are disposed between isolation gate circuits 160, which are connected to the memory cell blocks through the bit line pairs. As sense amplifier-input/output gating circuits 140 are shared by the two adjacent memory cell blocks $100_j$ and $100_{j+1}$, one of the adjacent memory cell blocks should be electrically isolated from the circuits 140 while the other of the memory cell blocks are using the circuit 140 during a read operation. Therefore, isolation gate circuits 160 are disposed between the circuits 140 and the memory cell blocks. Each of isolation gate circuits 160 comprises two NMOS transistors M4 and M5. Gates of the NMOS transistors of the circuits 160 at the side of memory cell block 100j are connected to the signal $ISO_j$ in common and gates of the NMOS transistors of the circuits 160 at the opposite side of memory cell block 100j+1 to the signal $ISO_{j+1}$.

Figure 3:
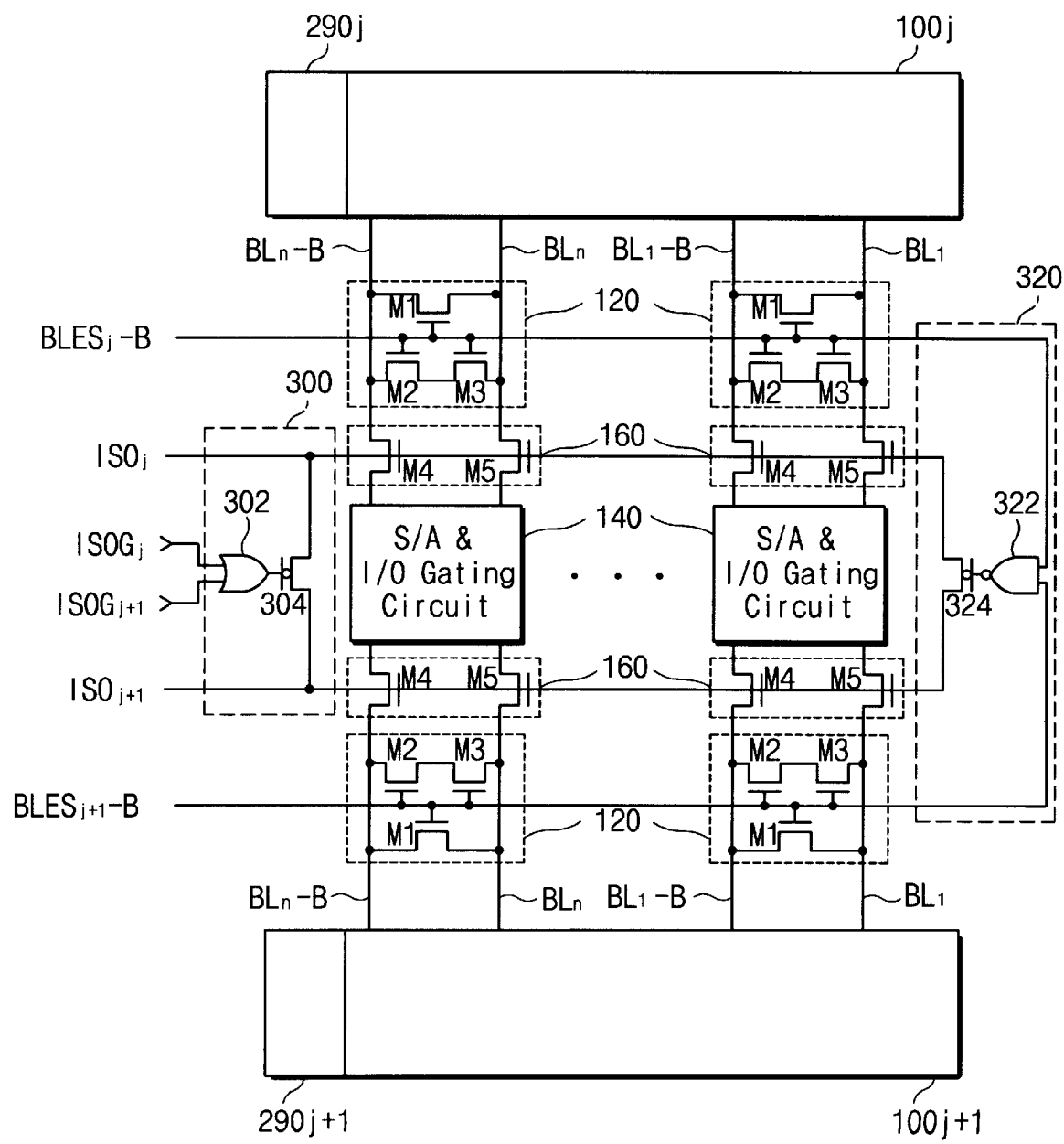
FIG. 3 illustrates a configuration of a memory core circuit, which receives the isolation and equalizing signals, including an equalizing circuit, according to a preferred embodiment of the present invention.

Now, as shown in FIG. 3, two isolation gate equalizing circuits are provided for the two adjacent memory cell blocks. The first isolation gate equalizing circuit 300 includes a PMOS transistor 304 connected between the signals $ISO_j$ and $ISO_{j+1}$, and an OR gate 302 receiving the signals $ISOG_j$ and $ISOG_{j+1}$. The output of OR gate 302 is coupled to the gate of the PMOS transistor 304. The second isolation gate equalizing circuit 320 includes a PMOS transistor 324 connected between the signals $ISO_j$ and $ISO_{j+1}$, and a NAND gate 322 receiving the signals $ISOG_j$ and $ISOG_{j+1}$. The output of the NAND gate 322 is coupled to the gate of the PMOS transistor 324.

Figure 4:
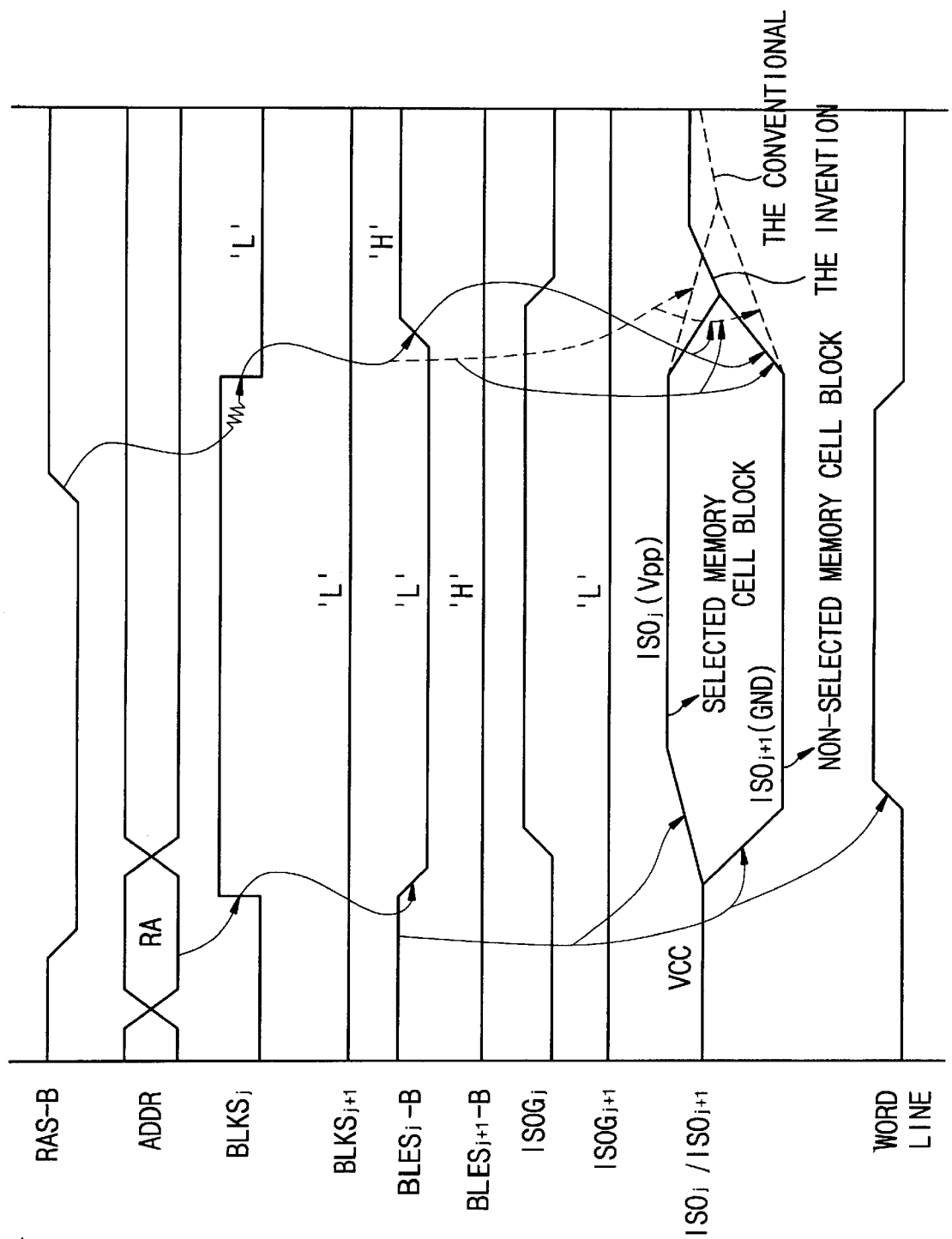
FIG 4. is a timing diagram showing a row precharge operation with the isolation and equalizing signals in the circuit of FIG. 3.

The operation of these circuits will be explained in detail as follows, referring to FIG. 4 showing a preferred row precharge operation according to a preferred embodiment of the invention. As the row address strobe signal RAS-B goes to a low level from its precharge state of a high level, the external address signals $A_i$ are applied to the address buffer 200. Then, the row address signals $RA_i$ are generated from the address buffer 200 and are applied to the row decoder $290_j$ and $290_{j+1}$, each assigned to the memory cell blocks $100_j$ and $100_{j+1}$. At the same time, the block selection decoder 220, responding to the row address strobe signal RAS-B receives the address signal $RA_k$ to select one of the memory cell blocks $100_j$ and $100_{j+1}$. The block selection decoder then raises the signal $BLKS_j$ to a high level to activate the memory cell block $100_j$, and lowers the signal $BLKS_{j+1}$ to a low level that does not activate the memory cell block $100_{j+1}$. As a result, the row decoder $290_j$ assigned to the selected memory cell block $100_j$ decodes the row address signals $RA_i$ supplied from the address buffer circuit 200, and then activates one of the word lines arranged in the memory cell block $100_j$.

Meanwhile, the second control circuit 260 receives the block selection signal $BLKS_j$ at a high level and the signal $INV_{j+1}$ at a high level and generates the signal $ISO_j$ to switch on the NMOS transistors M4 and M5 of the isolation gate circuit 160 disposed at the side of the memory cell block $100_j$. The voltage level of the signal $ISO_j$ is preferably $V_{PP}$, i.e., higher than that of the power source voltage. Thus, one of the bit line pairs in the selected memory cell block $100_j$ is connected to the corresponding sense amplifier-input/output gating circuit 140. At this time, the second control circuit 280 for the non-selected memory cell block $100_{j+1}$ generates the signal $ISO_{j+1}$ at a low level that switches off the NMOS transistors M4 and M5 of the isolation gate equalizing circuit 160 disposed at the side of the non-selected memory cell block $100_{j+1}$. The voltage level of the signal $ISO_{j+1}$ is held to the ground voltage. Thus, the non-selected memory cell block $100_{j+1}$ is electrically isolated from the sense amplifier-input/output gating circuits 140 disposed at the side of itself.

The first control circuit 240, responding to the block selection signal $BLKS_j$, generates the bit line equalizing signal $BLES_j$-B at a low level to control the bit line equalizing circuit 120 assigned to the selected memory cell block $100_j$. Thus, the bit line equalizing circuit 120 disposed at the side of the selected memory cell block $100_j$ is not a operable. On the other hand another first control circuit (not shown) generates the signal $BLES_{j+1}$-B at a high level to activate the bit line equalizing circuit 120 disposed at the side of the non-selected memory cell block $100_{j+1}$.

After a selected word line is disabled, responding to the transition of the row address strobe signal RAS-B to the precharge mode, the activated signals $BLKS_j$ and $BLES_j$-B are shut down to low and high levels, respectively, and so an operation of the present device moves from the row precharge cycle to the next read cycle. To accomplish this, the isolation gate equalizing circuit 300, responding to $ISOG_j$ and $ISOG_{j+1}$, of low levels, equalizes and precharges the signals $ISO_j$ and $ISO_{j+1}$ to the same voltage level. The bit line equalizing signals $BLES_j$-B applied to the bit line equalizing circuits 120 of the memory cell block $100_j$ then move to a high level to set bit line pairs connected to $100_j$ to the same voltage level. In this case, the signal $BLES_{j+1}$-B has been held to low level. The isolation gate equalizing circuit 320, responding to the signals $BLES_j$-B and $BLES_{j+1}$-B, both at high levels, also equalizes and precharges the signals $ISO_j$ and $ISO_{j+1}$, which have been set to $V_{pp}$ and the ground voltage (GND), respectively, together with the first equalization circuit 300. The broken lines in FIG. 4 plot a configuration about the recovery of the isolation signals to their precharge states in the conventional art, as compared with that of the preferred embodiment of the invention.

According to the aforementioned, discussion, since the isolation signals are equalized at the same time and accelerated by the two equalizing circuits, the drivability and speed of the row precharge operation can be enhanced. Considering there are a multiplicity of repetitions in performing read and write cycles and interstitial row precharge cycles in a semiconductor memory device, the shortening of precharging the isolation signals causes an increase of an overall operating speed in a semiconductor memory device.

While the foregoing discussion provides a full and complete disclosure of the preferred embodiments of the present invention, various modification, alternate constructions and equivalents thereof may be employed without departing from the true spirit and scope of the invention. Therefore, the above description and illustration should not be construed as limiting the scope of the invention, which is defined by the appended claims.

What is claimed is:

1. A semiconductor memory device comprising:
    a plurality of memory cell blocks;
    a plurality of bit line pairs connected to the memory cell blocks;
    a plurality of sense amplifiers connected to the bit line pairs;
    one or more bit line equalizing circuit for equalizing the bit line pairs in the memory cell blocks in response to bit line equalizing signals;
    one or more isolation gate circuits disposed between the sense amplifiers and the memory cell blocks, and responsive to isolation signals;
    a first circuit for equalizing the isolation signals in response to isolation gate equalizing signals; and
    a second circuit for equalizing the isolation signals in response to bit line equalizing signals.

2. A semiconductor memory device as recited in claim 1, further comprising a block selection circuit for generating a plurality of block selection signals in response to address signals.

3. A semiconductor memory device as recited in claim 1, further comprising a first control circuit for generating the bit line equalizing signals in response to the block selection signals.

4. A semiconductor memory device as recited in claim 3, further comprising a second control circuit for generating the isolation signals and the isolation gate equalizing signals in response the block selection signals.

5. A semiconductor memory device comprising:
    a plurality of memory cell blocks;
    a plurality of bit line pairs connected to the plurality of memory cell blocks;
    a plurality of sense amplifiers connected to the plurality of bit line pairs;
    one or more bit line equalizing circuits for equalizing the bit line pairs in the memory cell blocks in response to bit line equalizing signals;
    one or more isolation gate circuits disposed between the sense amplifiers and the memory cell blocks, and responsive to isolation signals;
    a block selection circuit for generating plurality of block selection signals in response to address signals;
    a plurality of first control circuits for generating the bit line equalizing signals in response to the block selection signals;

a plurality of second control circuits for generating the isolation signals and isolation gate equalizing signals in response to the block selection signals;

a first circuit for equalizing the isolation signals in response to the isolation gate equalizing signals; and a second circuit for equalizing the isolation signals in response to the bit line equalizing signals.

6. A semiconductor memory device as recited in claim 5, wherein adjacent first and second second control circuits generate first and second control signals, respectively, the first and second control signals acting to control the equalization of the isolation signals generated by the first and second second control circuits.

7. A semiconductor memory device having at least two memory cell blocks coupled to at least a pairs of bit lines, and a sense amplifier coupled to the pairs of bit lines, and being shared by the memory cell blocks, the device comprising:

one or more bit line equalizing circuits for equalizing the bit line pairs in the memory cell blocks;

one or more isolation gate circuits disposed between the sense amplifiers and the memory cell blocks;

a block selection circuit for generating plurality of block selection signals in response to address signals;

a first control circuit for generating bit line equalizing signals applied to the bit line equalizing circuits, responding to an output of the block selection circuit;

a second control circuit for generating isolation signals and isolation gate equalizing signals;

a first circuit for equalizing the isolation signals in response to the isolation gate equalizing signals; and a second circuit for equalizing the isolation signals in response to the bit line equalizing signals.

* * * * *